(12) United States Patent
Youn et al.

(10) Patent No.: US 8,173,729 B2
(45) Date of Patent: May 8, 2012

(54) PHOTOSENSITIVE RESIN COMPOSITION

(75) Inventors: Hyoc-min Youn, Hwaseong (KR);
Byung-uk Kim, Hwaseong (KR);
Ki-hyuk Koo, Hwaseong (KR);
Tae-hoon Yeo, Hwaseong (KR); Joo-pyo Yun, Hwaseong (KR); Hong-dae Shin, Hwaseong (KR); Sang Hoon Lee, Hwaseong (KR); Dong-myung Kim, Hwaseong (KR); Su-youn Choi, Hwaseong (KR); Jin Sun Kim, Hwaseong (KR); Chang-Min Woo, Hwaseong (KR); Hong-Suk Kim, Hwaseong (KR)

(73) Assignee: Dongjin Semichem Co., Ltd. (KR)

( * ) Notice: Subject to any disclaimer, the term of this patent is extended or adjusted under 35 U.S.C. 154(b) by 68 days.

(21) Appl. No.: 12/714,837

(22) Filed: Mar. 1, 2010

(65) Prior Publication Data
US 2010/0222473 A1    Sep. 2, 2010

(30) Foreign Application Priority Data

Mar. 2, 2009  (KR) .................. 10-2009-0017696

(51) Int. Cl.
*C08K 5/3447* (2006.01)
*C08K 5/3492* (2006.01)
*C08K 5/3435* (2006.01)

(52) U.S. Cl. ........... 524/105; 524/99; 524/100; 524/500

(58) Field of Classification Search .................. 524/99, 524/100, 105, 500
See application file for complete search history.

(56) References Cited

U.S. PATENT DOCUMENTS
2008/0051483 A1 * 2/2008 Cho et al. .................. 522/62

OTHER PUBLICATIONS
Peng et al. Photochemistry and Photobiology, 2000, 71(2), 149-156.*

* cited by examiner

*Primary Examiner* — David W Wu
*Assistant Examiner* — Vu A Nguyen
(74) *Attorney, Agent, or Firm* — Cantor Colburn LLP

(57) ABSTRACT

The present invention relates to a photosensitive resin composition, particularly to a photosensitive resin composition for forming an interlayer organic insulating film for TFT-LCD, comprising 0.01 to 20 wt % of UV stabilizer or radical scavenger. The photosensitive resin composition of the present invention can be used for forming an interlayer organic insulating film for TFT-LCD to improve active unfilled area upon over exposure in liquid crystal photo-alignment process, can easily control resolution of pattern, and is particularly suitable for forming a planarization layer of an interlayer organic insulating film.

7 Claims, No Drawings

PHOTOSENSITIVE RESIN COMPOSITION

BACKGROUND

1. Field

The present invention relates to a photosensitive resin composition, more particularly to a photosensitive resin composition that can be used for forming an interlayer organic insulating film for TFT-LCD to improve active unfilled area upon over exposure in liquid crystal photo-alignment process, can easily control resolution of pattern, and is particularly suitable for forming a planarization layer of an interlayer organic insulating film.

2. Description of the Related Art

In TFT liquid crystal display device or integrated circuit device, in order to insulate space between wires disposed between layers, an organic insulating layer is used.

Particularly, for photo-alignment for TFT-LCD, very large amount of exposure energy should be used so as not to cause problems such as image retention.

If the existing photosensitive resin is used for an interlayer organic insulating film for photo-alignment, light resistance may be deteriorated and the interlayer organic insulating film may be aged due to over exposure to generate sublimates or decomposed substances thus polluting liquid crystal. And, if liquid crystal is polluted by such phenomenon, area that is not filled with liquid crystal may be generated in pixel. Therefore, there is urgent need for improvement thereof.

SUMMARY

It is an object of the present invention to provide a photosensitive resin composition that can be used for forming an interlayer organic insulating film for TFT-LCD to improve active unfilled area upon over exposure in liquid crystal photo-alignment process, can easily control resolution of pattern, and is particularly suitable for forming a planarization layer of an interlayer organic insulating film.

In order to achieve the object, the present invention provides a photosensitive resin composition for forming an interlayer organic insulating film for TFT-LCD, comprising 0.01 to 20 wt % of UV stabilizer or a radical scavenger.

The present invention also provides a method for forming an interlayer organic insulating film for TFT-LCD using the photosensitive resin composition.

The present invention also provides TFT-LCD comprising cured body of the photosensitive resin composition as an interlayer organic insulating film.

The photosensitive resin composition of the present invention can be used for forming an interlayer organic insulating film for TFT-LCD to improve active unfilled area upon over exposure in liquid crystal photo-alignment process, can easily control resolution of pattern, and is particularly suitable for forming a planarization layer of an interlayer organic insulating film

DETAILED DESCRIPTION

The present invention is explained in detail.

The present inventors confirmed that if 0.01 to 20 wt % of UV stabilizer or radical scavenger is comprised in a photosensitive resin composition for an interlayer organic insulating film, the composition can improve active unfilled area upon over exposure in liquid crystal photo-alignment process, can easily control resolution of pattern, and is particularly suitable for a planarization layer of an interlayer organic insulating film for TFT-LCD, and completed the present invention.

The photosensitive resin composition of the present invention comprises 0.01 to 20 wt % of UV stabilizer or radical scavenger.

The UV stabilizer or radical scavenger absorbs overexposure energy in liquid crystal photo-alignment process to convert it into harmless kinetic energy or thermal energy, thereby inhibiting light-induced decomposition of an interlayer organic insulating film and generation of sublimates by color changed organics, etc. Thus, the UV stabilizer and radical scavenger absorb UV against over exposure and remove it to secure reliability of an interlayer organic insulating film at a liquid crystal mode where crosslinking and alignment of liquid crystal should be proceeded through over exposure.

Specifically, the UV stabilizer or radical scavenger may include benzotriazole and derivatives thereof, triazine and derivatives thereof, piperidine and derivatives thereof, alone or in combinations thereof. And, it may be comprised in the photosensitive resin composition in the content of 0.01 to 20 wt %, more preferably 0.1 to 10 wt %. Most preferably, both of the UV stabilizer and the radical scavenger may be comprised in each contents of 0.1 to 10 wt %.

The benzotriazole and derivatives thereof may include hydroxyphenylbenzotriazole; 2,2'-methylene-bis(6-(2H-benzotriazole-2-yl)-4-(1,1,3,3-tetratmethylbutyl)-phenol; 2-(2'-hydroxymethylphenyl)benzotriazole; 2-[2'-hydroxy-3',5'-bis(α,α-dimethylbenzylphenyl]benzotriazole; 2-(2'-hydroxy-3',5'-dibutylphenyl)benzotriazole; 2-(2' hydroxy-3'-tertiary-butyl-5'-methylphenyl)-5-chlorobenzotriazole; 2-(2' hydroxy-3',5'-di-tertiary-butylphenyl)-5-chlorobenzotriazole; 2-(2' hydroxy-3',5'-di-tertiary-amyl)benzotriazole; 2-(2'-hydroxy-5'-tertiary-octylphenyl)benzotriazole; or 2,2'-methylenebis[4-(1,1,3,3-tetramethylbutyl)-6-(2-N-benzotriazo-2-yl)phenol].

The triazine and derivatives thereof may include hydroxyphenyl-S-triazine; 2-(4'-methoxyphenyl)-4,6-bis(2' hydroxy-4'-n-octyloxyphenyl)-1,3,5-triazine; 2,4-bis{[4-(3-(2-propyloxy)-2-hydroxy-propyloxy)-2-hydroxy]-phenyl}-6-(4-methoxyphenyl)-1,3,5-triazine; 2,4-bis{[4-(2-ethylhexyloxy)-2-hydroxy]-phenyl}-6-[4-(2-methoxyethyl-carboxyl)-phenylamino]-1,3,5-triazine; 2,4-bis{[4-(tris (trimethylsilyloxy-silylpropyloxy)-2-hydroxy]-phenyl}-6-(4-methoxyphenyl)-1,3,5-triazine; 2,4-bis{[4-(2'-methylprophenyloxy)-2-hydroxy]-phenyl}-6-(4-methoxyphenyl)-1,3,5-triazine; 2,4-bis{[4-(1',1',1',3',5',5',5'-heptamethyltrisilyl-2'-methyl-propyloxy)-2-hydroxy]-phenyl}-6-(4-methoxyphenyl)-1,3,5-traizine; 2,4-bis{[4-(4-(2-propyloxy)-2-hydroxy-propyloxy)-2-hydroxy]-phenyl}-6-[4-ethylcarboxy)-phenylamino]-1,3,5-triazine; or 2,4,6-trianiline-(p-carbo-2'-ethyl-1'-oxy)-1,3,5-triazine, etc.

The piperidine and derivatives thereof may include 4-benzoyl-2,2,6,6-tetramethylpiperidine; or 4-stearyloxy-2,2,6,6-tetramethyl-piperidine, etc.

And, commercial UV stabilizer or radical scavenger may be used. For examples, as UV stabilizer, TINUVIN 109, 171, 384-2, 400, 405, 411L, 328, 900, 928, 384-2, 460, 477, 479, CGL77MPA-D type, etc. from Ciba Company may be used, and derivatives of similar type be used alone or in combinations, and, as radical scavenger, TINUVIN 123, 292, 292HP, 144 type and CGL 052, etc. from Ciba Company may be used, and derivatives of similar type may be used alone or in combinations.

And, as the photosensitive resin composition of the present invention, a common photosensitive resin composition for forming an interlayer organic insulating film may be used except the UV stabilizer or radical scavenger. Preferably, the photosensitive resin composition may comprise a) 5 to 40 wt % of copolymer resin; b) 0.01 to 30 wt % of a photoinitiator; c) 0.5 to 40 wt % of multifunctional monomers having an ethylenic unsaturated bond; d) 0.01 to 20 wt % of the UV stabilizer or radical scavenger; and e) the remaining contents of a solvent.

The copolymer resin may include common copolymer resin used for a negative photosensitive resin composition, and preferably acrylic copolymer resin or polyimide copolymer resin may be used. The polystyrene converted weight average molecular weight of the copolymer resin may be preferably 5000-20000. In the above range, resolution, remaining rate, heat resistance, sensitivity, etc. of the organic insulating layer can be satisfied.

The content of the copolymer resin may be in the range of 5 to 40 wt % of the photosensitive resin composition. In the above range, degree of planarization, resolution, heat resistance, transmittance, impact resistance, etc. as well as sensitivity can be simultaneously satisfied.

For examples, the acrylic copolymer can be obtained by radical synthesis using i) unsaturated carbonic acid or an anhydride thereof, ii) an unsaturated compound containing an epoxy group and iii) an olefinic unsaturated compound as monomers in the presence of a solvent and a polymerization initiator, and removal of unreacted monomers by precipitation and filtration, and vacuum drying.

The unsaturated carbonic acid, unsaturated carbonic acid anhydride, or a mixture thereof may include unsaturated monocarbonic acid such as acrylic acid, methacrylic acid, etc; unsaturated dicarbonic acid such as maleic acid, fumaric acid, citraconic acid, methaconic acid, itaconic acid, etc.; or unsaturated dicarbonic acid anhydride, alone or in combinations, and particularly, acrylic acid, methacrylic acid, or maleic anhydride is preferable because of copolymerization reactivity and solubility in a developer of an alkaline aqueous solution.

The unsaturated carbonic acid, unsaturated carbonic acid anhydride, or a mixture thereof may be comprised in the content of 15 to 45 parts by weight, based on the contents of total monomers. In the above range, solubility in an alkaline aqueous solution is most ideal.

The unsaturated compound containing epoxy group may include glycidyl acrylate, glycidyl methacrylate, glycidyl α-ethylacrylate, glycidyl α-n-propylacrylate, glycidyl α-n-butylacrylate, β-methylglycidyl acrylate, β-methylglycidyl methacrylate, β-ethylglycidyl acrylate, β-ethylglycidyl methacrylate, 3,4-epoxybutyl acrylate, 3,4-epoxybutyl methacrylate, 6,7-epoxyheptyl acrylate, 6,7-epoxyheptyl methacrylate, 6,7-epoxyheptyl α-ethyl-acrylate, o-vinylbenzyl glycidyl ether, m-vinylbenzyl glycidyl ether, or p-vinylbenzyl glycidyl ether, 3,4-epoxycyclohexyl methacrylate, etc., alone or in combinations.

Particularly, the unsaturated compound containing epoxy group may be preferably glycidyl methacrylate, β-methylglycidyl methacrylate, 6,7-epoxyheptyl methacrylate, o-vinylbenzyl glycidyl ether, m-vinylbenzyl glycidyl ether, or p-vinylbenzyl glycidyl ether, 3,4-epoxycyclohexyl methacrylate, etc. because they can improve copolymerization reactivity and heat resistance of obtained patterns.

The unsaturated compound containing epoxy group may be comprised in the contents of 15 to 45 parts by weight, based on the content of total monomers. In the above range, heat resistance of an organic insulating layer and storage stability of the photosensitive resin composition can be simultaneously satisfied.

The olefinic unsaturated compound may include methylmethacrylate, ethylmethacrylate, n-butyl methacrylate, sec-butyl methacrylate, tert-butyl methacrylate, methylacrylate, isopropyl acrylate, cyclohexyl methacrylate, 2-methylcyclohexyl methacrylate, dicyclopentenyl acrylate, dicyclopentanyl acrylate, dicyclopentanyl methacrylate, dicyclopentanyl methacrylate, 1-adamantyl acrylate, 1-adamantyl methacrylate, dicyclopentanyl oxyethylmethacrylate, isoboronyl methacrylate, cyclohexylacrylate, 2-methylcyclohexyl acrylate, dicyclopentanyl oxyethylacrylate, isoboronyl acrylate, phenylmethacrylate, phenylacrylate, benzylacrylate, 2-hydroxyethyl methacrylate, styrene, σ-methyl styrene, m-methyl styrene, p-methyl styrene, vinyltoluene, p-methoxy styrene, 1,3-butadiene, isoprene, or 2,3-dimethyl 1,3-butadiene, etc., alone or in combinations.

Particularly, the olefinic unsaturated compound may be preferably styrene, dicyclopentanyl methacrylate, or p-methoxy styrene because of copolymerization reactivity and solubility in a developer of an alkaline aqueous solution.

The olefinic unsaturated compound may be comprised in the contents of 25 to 70 parts by weight, based on the contents of total monomers, preferably 25 to 45 parts by weight. In the above range, swelling is prevented after development, and solubility in a developer of an alkaline aqueous solution can be ideally maintained.

The solvent used for solution polymerization of the above monomers may include methanol, tetrahydroxyfuran, toluene, dioxane, etc.

The polymerization initiator used for solution polymerization of the above monomers may include a radical polymerization initiator, and for examples, 2,2-azobisisobutyronitrile, 2,2-azobis(2,4-dimethyl valeronitrile), 2,2-azobis(4-methoxy 2,4-dimethyl valeronitrile), 1,1-azobis(cyclohexane-1-carbonitrile), or dimethyl 2,2'-azobisisobutylate, etc.

The acrylic copolymer obtained by radical reaction of the above monomers in the presence of the solvent and the polymerization initiator, and removal of unreacted monomers by precipitation and filtration, and vacuum drying may preferably have polystyrene converted weight average molecular weight (Mw) of 5,000 to 20,000.

The photoinitiator may include triazine type, benzoin, acetophenone type, imidazole type, xanthone or oxime ester type, etc., and for examples, 2,4-bistrichloromethyl-6-p-methoxystyryl-s-triazine, 2-p-methoxystyryl-4,6-bistrichloromethyl-s-triazine, 2,4-trichloromethyl-6-triazine, 2,4-trichloromethyl-4-methylnapthyl-6-triazine, benzophenone, p-(diethylamino)benzophenone, 2,2-dichloro-4-phenoxyacetophenone, 2,2-diethoxyacetophenone, 2-dodecyl thioxanthone, 2,4-dimethyl thioxanthone, 2,4-diethyl thioxanthone, 2,2-bis-2-chlorophenyl-4,5,4,5-tetraphenyl-2-1,2-biimidazole, Irgacure 369, Irgacur 651, Irgacure 907, Darocur TPO, Irgacure 819, OXE-01, OXE-02 from Ciba Specialty Chemicals, N-1919, NCI-831 from Adeka Company, etc. may be used alone or in combinations.

If the content of the photoinitiator is less than 0.01 wt %, the remaining rate may be deteriorated due to low sensitivity, and if it exceeds 30 wt %, storage stability is not good and adhesion of patterns may be deteriorated when developing due to high degree of cure.

The multifunctional monomers having an ethylenic unsaturated bond is generally a crosslinkable monomer having 2 or more ethylenic double bonds, and, it may include 1,4-butandiol diacrylate, 1,3-butyleneglycol diacrylate, ethyleneglycol diacrylate, trimethylolpropane diacrylate, trimethylolpropane triacrylate, pentaerythrytol triacrylate, pentaerythrytol tetraacrylate, triethyleneglycol diacrylate, polyethyleneglycol diacrylate, dipentaerythrytol hexadiacrylate, dipentaerythrytol tridiacrylate, dipentaerythrytol diacrylate, sorbitol triacrylate, bisphenol A diacrylate derivatives, dipentaerythrytol polyacrylate, or methacrylates thereof.

The multifunctional monomer having an ethylenic unsaturated bond may be comprised in the content of 0.5 to 40 wt %, more preferably 5 to 20 wt %. If the content is less than 0.5 wt %, realization of pattern and contact hole may be difficult due to low degree of cure with photosensitive resin, and if it exceeds 40 wt %, resolution of pattern and contact hole may be deteriorated when developing due to high degree of cure.

The UV stabilizer or radical scavenger is as described above.

The solvent may improve planarization and prevent coating stain thus forming uniform pattern profile.

The solvent may include alcohols such as methanol, ethanol, benzylalcohol, hexylalcohol, etc.; ethylene glycol alkyl ether acetate such as ethylene glycol methyl ether acetate, ethylene glycol ethyl ether acetate, etc.; ethylene glycol alkyl ether propionate such as ethylene glycol methyl ether propionate, ethylene glycol ethyl ether propionate, etc.; ethylene glycol monoalkyl ether such as ethylene glyocol methyl ether, ethylene glycol ethyl ether, etc.; diethylene glycol alkyl ether such as dithylene glycol monomethyl ether, diethylene glycol monoethyl ether, diethylene glycol dimethyl ether, diethylene glycol methylethyl ether, etc.; propylene glycol alkyl ether acetate such as propylene glycol methyl ether acetate, propylene glycol ethyl ether acetate, propylene glycol propyl ether acetate, etc.; propylene glycol alkyl ether propionate such as propylene glycol methyl ether propionate, propylene glycol ethyl ether propionate, propylene glycol propyl ether propionate, etc.; propylene glycol monoalkylether such as propylene glycol methyl ether, propylene glycol ethyl ether, propylene glycol propyl ether, propylene glycol butyl ether, etc.; dipropylene glycol alkyl ether such as dipropylene glycol dimethylether, dipropylene glycol diethylether, etc.; butylene glycol monoalkyl ether such as butylenes glycol monomethyl ether, butylene glycol monoethyl ether, etc.; dibutylene glycol alkyl ether such as dibutylene glycol dimethylether, dibutylene glycol diethylether, etc.

The solvent may be comprised in the remaining contents of total photosensitive resin composition, preferably 50 to 90 wt %. In the above range, coatibility and storage stability of the photosensitive resin composition can be improved.

The photosensitive resin composition of the present invention may further comprise epoxy resin, an adhesive, sensitivity enhancer or surfactant.

The epoxy resin may increase heat resistance, sensitivity, etc. of pattern obtained from the photosensitive resin composition.

The epoxy resin may include bisphenol A type epoxy resin, phenol novolac type epoxy resin, cresol novolac type epoxy resin, cycloaliphatic epoxy resin, glycidyl ester type epoxy resin, glycidyl amine type epoxy resin, heterocyclic epoxy resin, and resin obtained by (co)polymerization with glycidyl methacrylate different from the acrylic copolymer, and particularly bisphenol A type epoxy resin, cresol novoalc type epoxy resin, or glycidyl ester type epoxy resin is preferable.

The epoxy resin may be comprised in the content of 0.01 to 10 wt % of the photosensitive resin composition, and in the above range, coatibility and adhesion can be improved.

The adhesive may improve adhesion to a substrate, and it may be comprised in the content of 0.01 to 10 wt % of the photosensitive resin composition.

The adhesive may include a silane coupling agent having reactive substituents such as carboxyl group, methacryl group, isocyanate group, or epoxy group. For examples, it may include γ-methacryloxypropyltrimethoxysilane, vinyltriacetoxysilane, vinyltrimethoxysilane, γ-isocyanate propyltriethoxysilane, γ-glycidoxy propyltrimethoxysilane, or β-(3,4-epoxy cyclohexyl)ethyltrimethoxysilane, etc.

The sensitivity enhancer may include dioctyl phthalate, diisononyl phthalate, dioctyl adipate, tricresyl phosphate, and 2,2,4-trimethyl-1,3-pentanediol monoisobutyrate, and it may be comprised in the content of 0.1 to 10 wt % of the photosensitive resin composition.

The surfactant may improve coatibility or development of the photosensitive composition.

The surfactant may include polyoxyethylene octylphenyl ether, polyoxyethylene nonylphenyl ether, F171, F172, F173 (product name: Dainippon Ink and Chemicals, Incorporated), FC430, FC431 (product name: Sumitomo 3m Ltd), or KP341 (product name: Shin-Etsu Chemical Co. Ltd.).

The surfactant may be comprised in the content of 0.0001 to 2 wt % of the photosensitive resin composition, and in the above range, coatibility or development of the photosensitive composition may be improved.

The solid concentration of the photosensitive resin composition may be preferably 10 to 50 wt %, and the composition having the above range of solid content may be preferably used after filtering with 0.1-0.2 μm millipore filter, etc.

The present invention also provides a method for forming an interlayer organic insulating film for TFT-LCD using the photosensitive resin composition, and a display comprising cured body of the photosensitive resin composition as an interlayer organic insulating film for TFT-LCD.

The method for forming an interlayer organic insulating film of TFT-LCD uses the above photosensitive resin composition to form patterns as an interlayer organic insulating film of TFT-LCD. And, common pattern formation method such as a method comprising coating of a photosensitive resin composition on a substrate-prebaking-exposure-development can be used therefor.

For example, a method for forming an interlayer organic insulating film of TFT-LCD is as follows.

First, the photosensitive resin composition is coated on the surface of a substrate by spray method, roll coating method, rotation coating, etc., and a solvent is removed by prebake to form a coating. The prebake may be preferably conducted at a temperature of 80-115° C. for 1-15 minutes.

Then, visible rays, UV, EUV, electronic rays, x-rays, etc. are irradiated to the coating according to the predetermined pattern, and unnecessary parts are removed by developing with a developer to form a pattern.

The developer may be preferably an alkaline aqueous solution, and concretely, it may include inorganic alkali such as sodium hydroxide, potassium hydroxide, sodium carbonate; primary amine such as ethylamine, n-propylamine; secondary amine such as diethylamine, n-propylamine, etc.; tertiary amine such as trimethylamine, methyldiethylamine, dimethylethylamine, triethylamine, etc.; alcohol amine such as dimethyl ethanolamine, methyl diethanolamine, triethanolamine, etc.; or, an aqueous solution of quaternary ammonium salt such as tetramethyl ammonium hydroxide, tetraethyl ammonium hydroxide, etc. The developer may be obtained by dissolving alkaline compounds in the concentration of 0.01-10 wt %, and an aqueous organic solvent such as methanol, ethanol, etc. and surfactant may be added in an appropriate amount.

After developing with the developer, unnecessary part is removed by washing with ultrapure water for 30-90 seconds and dried to form a pattern, light such as UV is irradiated to the formed pattern, and then, the pattern is heated at a temperature of 150-250° C. for 30-90 minutes with a heater such as an oven to obtain a final pattern.

The following examples illustrate this disclosure in more detail. However, it is understood that this disclosure is not limited by these examples.

EXAMPLE

Example 1

Into a 2 L flask equipped with a cooler and an agitator, a mixed solution of 400 parts by weight of isopropylalcohol, 30 parts by weight of methacrylic acid and 30 parts by weight of styrene, 25 parts by weight of glycidyl methacrylate, 15 parts by weight of 2-hydroxyethylacrylate was introduced. The liquid composition was sufficiently mixed at 600 rpm in a mixing container, and then, 15 parts by weight of 2,2'-azobis (2,4-dimethyl valeronitrile) was added thereto. Temperature of the mixed solution was slowly elevated to 50° C., and the temperature was maintained for 6 hours to obtain a copolymer solution. To the obtained polymer, 500 ppm of phosphite was added as a polymerization inhibitor. Temperature of the polymerization-stopped flask was dropped to 18° C. and maintained for 1 hours, and then precipitates were obtained and filtered. Using 85 parts by weight of the filtered precipitates as a solvent, propyleneglycol monoethylpropionate was added so that the contents of the precipitates reach 45 wt %, to obtain acrylic copolymer, and weight average molecular weight (Mw) of acrylic polymer of the obtained polymer solution was 9,000.

100 parts by weight of the polymer solution comprising acylic acid copolymer, 10 parts by weight of OXE-02 as a photoinitiator, 40 parts by weight of dipentaerythrytol hexadiacrylate as crosslinkable monomers, and 10 part by weight of TINUVIN 400 as UV stabilizer were mixed. To the mixture, diethyleneglycol dimethylether was added so that solid concentration reach 35 wt %, and dissolved, and then, the solution was filtered with 0.2 μm millipore filter to prepare a negative photosensitive resin composition.

Example 2

100 parts by weight of the polymer solution comprising acrylic copolymer prepared in the Example 1, 5 parts by weight of N-1919 as a photoinitiator, 30 parts by weight of dipentaerythrytol hexaacrylate as crosslinkable monomers, 5 parts by weight of TINUVIN 460 and 5 parts by weight of TINUVIN 292 as UV stabilizer and radical scavenger were mixed. To the mixture, PGMEA was added so that solid concentration is 35 wt % and dissolved, and then, the solution was filtered with 0.2 μm millipore filter to prepare a negative photosensitive resin composition solution.

Example 3

To a flask equipped with a cooler and agitator, 50 parts by weight of 2,2-bis(3-amino-4-hydroxyphenyl)hexafluorpropane, and 50 hexafluorpropane of 4,4-(hexafluor-isopropylidene)diphthalic anhydride were introduced, NMP was added at a room temperature, and the mixture was agitated for 24 hours and reacted. In order to remove water produced by imidation reaction in the produced polyamic acid, xylene was added in the same amount of the NMP, and the mixture was reacted at 160° C. for 5 hours to prepare polyimide. Soluble polyimide (6FDA/BAPAF) was dissolved in DMAc under nitrogen atmosphere, and then, triethyl amine was dropped in the same equivalent weight as photosensitive group methacryloyl-chloride, and the mixture was reacted at 0° C. for 12 to prepare photosensitive polyimide copolymer. Molecular weight of the prepared polyimide copolymer was 15000.

100 parts by weight of the polymer solution comprising polyimide copolymer as prepared above, each 5 parts by weight of OXE-02 and NCI-831 as a photoinitiator, 20 parts by weight of dipentaerythritol hexadiacrylate as crosslinkable monomers, 5 parts by weight of TINUVIN 479 and 5 parts by weight of TINUVIN 292HP as UV stabilizer and radical scavenger were mixed. To the mixture, PGMEA was added so that solid concentration is 35 wt % and dissolved, and then, the solution was filtered with 0.2 μm millipore filter to prepare a negative photosensitive resin composition solution.

Comparative Example 1

A negative photosensitive resin composition was prepared in the same method as Example 1, except that a negative photosensitive resin composition was prepared with the composition as described in the following Table 1. In the Table 1, each numerical value is indicated by parts by weight.

TABLE 1

|  | copolymer resin | photoinitiator | Crosslinking agent | UVstabilizer | radical scavenger |
| --- | --- | --- | --- | --- | --- |
| Example 1 | 100 | 10 | 40 | 10 | — |
| Example 2 | 100 | 5 | 30 | 5 | 5 |
| Example 3 | 100 | 10 | 20 | 5 | 5 |
| Comparative Example 1 | 100 | 10 | 40 | — | — |

Physical properties of the photosensitive resin compositions of the Examples 1-3 and Comparative Example 1 were evaluated as follows.

Evaluation of active unfilled area (AUA): After forming an organic insulating layer of TFT substrate using the photosensitive resin compositions of the Examples 1-3 and Comparative Example 1, it was bonded with CF substrate. Liquid crystal was injected by capillary phenomenon, and liquid crystal reaction was caused by exposure, and then, the degree of formation of active unfilled area was measured every 100 hours for 500 hours with sealing the panel. If active unfilled area is not formed until 500 hours, the photosensitive resin composition is identified as that for reliable organic insulating layer.

Evaluation of resolution: On a layer having TFT metal wire on the bottom, pattern was formed using the photosensitive resin compositions of the Examples 1-3 and Comparative 1 with Mask Size 10×12 um, and when Bias is 1 or less, resolution is indicated as excellent, when Bias is 2 or less, resolution is indicated as good, and when Bias is 3 or less, resolution is indicated as bad.

Evaluation of planarization: The photosensitive resin compositions of the Examples 1-3 and Comparative 1 were exposed to form a pattern, and then, thickness was measured at each 48 part of Glass, and when Uniformity is within 2%, planarization is indicated as excellent, when Uniformity is 2-5%, planarization is indicated as good, and when Uniformity is 5% or more, planarization is indicated as bad.

The results measured by the above methods are described in the following Table 2.

TABLE 2

|  | active unfilled area | resolution | planarization |
|---|---|---|---|
| Example 1 | Not formed until 500 hours | excellent | excellent |
| Example 2 | Not formed until 500 hours | excellent | excellent |
| Example 3 | Not formed until 500 hours | excellent | excellent |
| Comparative Example 1 | Formed around 100 hours | bad | good |

As shown in Table 2, the photosensitive resin compositions of Examples 1-3 of the present invention have remarkably improved active unfilled area compared to Comparative Example 1, and also have improved resolution and planarization.

What is claimed is:

1. A photosensitive resin composition for an interlayer organic insulating film for TFT-LCD, comprising a) 5 to 40 wt % of copolymer resin; b) 0.01 to 30 wt % of a photoinitiator; c) 0.5 to 40 wt % of multifunctional monomers having an ethylenic unsaturated bond; d) 1-10 wt % each of a UV stabilizer and a radical scavenger; and e) the remaining content of a solvent, wherein the UV stabilizer and the radical scavenger are selected from the group consisting of triazine and derivatives thereof, piperidine and derivative thereof, and combinations thereof.

2. The photosensitive resin composition according to claim 1, wherein the triazine and derivatives thereof are selected from the group consisting of hydroxyphenyl-S-triazine; 2-(4'-methoxyphenyl)-4,6-bis(2'hydroxy-4'-n-octyloxyphenyl)-1,3,5-triazine; 2,4-bis{[4-(3-(2-propyloxy)-2-hydroxy-propyloxy)-2-hydroxy]-phenyl}-6-(4-methoxyphenyl)-1,3,5-triazine; 2,4-bis{[4-(2-ethyl-hexyloxy)-2-hydroxyl-phenyl}-6-[4-(2-methoxyethyl-carboxyl)-phenylamino]-1,3,5-triazine; 2,4-bis{[4-(tris(trimethylsilyloxy-silylpropyloxy)-2-hydroxy]-phenyl}-6-(4-methoxyphenyl)-1,3,5-triazine; 2,4-bis{[4-(2'-methylprophenyloxy)-2-hydroxy]-phenyl}-6-(4-methoxyphenyl)-1,3,5-triazine; 2,4-bis{[4-(1',1',1',3',5',5',5'-heptamethyltrisilyl-2'-methyl-propyloxy)-2-hydroxy]-phenyl}-6-(4-methoxyphenyl)-1,3,5-triazine; 2,4-bis{[4-(4-(2-propyloxy)-2-hydroxy-propyloxy)-2-hydroxy]-phenyl}-6-[4-ethylcarboxy)-phenylamino]-1,3,5-triazine; and 2,4,6-trianiline-(p-carbo-2'-ethyl-1'-oxy)-1,3,5-triazine.

3. The photosensitive resin composition according to claim 1, wherein the piperidine and derivatives thereof are selected from the group consisting of 4-benzoyl-2,2,6,6-tetramethylpiperidine; and 4-stearyloxy-2,2,6,6-tetramethyl-piperidine.

4. The photosensitive resin composition according to claim 1, wherein the a) copolymer resin is acrylic copolymer or polyimide copolymer having weight average molecular weight of 5000-20000.

5. The photosensitive resin composition according to claim 1, wherein the composition further comprises epoxy resin, an adhesive, sensitivity enhancer, or surfactant.

6. A method for forming an interlayer organic insulating film for TFT-LCD comprising forming said insulating layer using the photosensitive resin composition of claim 1.

7. TFT-LCD comprising cured body of the photosensitive resin composition of claim 1 as an interlayer organic insulating film.

* * * * *